United States Patent
Golle et al.

(10) Patent No.: US 10,779,478 B2
(45) Date of Patent: *Sep. 22, 2020

(54) METHOD AND APPARATUS FOR AN ACOUSTIC-CONTROL LIGHT FIXTURE

(71) Applicants: Heilux, LLC, Eden Prairie, MN (US); Mark A. Pinchot, Solon, OH (US)

(72) Inventors: John T. Golle, Eden Prairie, MN (US); Aaron J. Golle, Farmington, MN (US); Barbara A. DeBaun, Woodbury, MN (US); David T. Doan, Hopkins, MN (US); Matthew P. Limpert, Bloomington, MN (US); Walter J. Paciorek, Phoenix, AZ (US); Charles A. Lemaire, Apple Valley, MN (US); Brad Dorholt, Minneapolis, MN (US); Mark A. Pinchot, Solon, OH (US)

(73) Assignees: Heilux, LLC, Eden Prairie, MN (US); Mark A. Pinchot, Solon, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/284,889

(22) Filed: Feb. 25, 2019

(65) Prior Publication Data

US 2019/0257507 A1    Aug. 22, 2019

Related U.S. Application Data

(63) Continuation of application No. 15/811,660, filed on Nov. 13, 2017, now Pat. No. 10,215,387.
(Continued)

(51) Int. Cl.
*A01G 7/04* (2006.01)
*H01L 25/075* (2006.01)
(Continued)

(52) U.S. Cl.
CPC .......... *A01G 7/045* (2013.01); *F21V 19/0015* (2013.01); *F21V 21/35* (2013.01);
(Continued)

(58) Field of Classification Search
CPC ...... F21V 19/0015; F21V 21/35; F21V 23/02; F21V 23/06; F21Y 2105/14; F21Y 2113/13; F21Y 2115/10; H05B 33/0857
See application file for complete search history.

(56) References Cited

U.S. PATENT DOCUMENTS 7,303,305 B2   12/2007   Kennedy
7,607,815 B2   10/2009   Pang
(Continued)

FOREIGN PATENT DOCUMENTS

JP    2012120477 A    6/2012

*Primary Examiner* — Seung H Lee
(74) *Attorney, Agent, or Firm* — Charles A. Lemaire; Jonathan M. Rixen; Lemaire Patent Law Firm, P.L.L.C.

(57) ABSTRACT

A light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum, wherein the first lighting sheet includes a plurality of holes through the insulating substrate of the first lighting sheet, wherein each one of the plurality of holes through the insulating substrate of the first lighting sheet is positioned between an adjacent pair of rows of electrical conductors and between an adjacent pair of columns of electrical conductors of the first lighting sheet; and an acoustic tile, wherein the first lighting sheet is mounted to the acoustic tile. Some embodiments include a plurality of layered light sheets, optionally individually controlled for color and/or brightness.

21 Claims, 9 Drawing Sheets

Related U.S. Application Data

(60) Provisional application No. 62/576,646, filed on Oct. 24, 2017, provisional application No. 62/574,194, filed on Oct. 18, 2017, provisional application No. 62/574,193, filed on Oct. 18, 2017, provisional application No. 62/574,172, filed on Oct. 18, 2017, provisional application No. 62/486,444, filed on Apr. 17, 2017, provisional application No. 62/421,970, filed on Nov. 14, 2016.

(51) Int. Cl.

| | | |
|---|---|---|
| *F21V 33/00* | (2006.01) | |
| *H05B 45/20* | (2020.01) | |
| *H05B 45/00* | (2020.01) | |
| *F21V 19/00* | (2006.01) | |
| *F21V 21/35* | (2006.01) | |
| *F21V 23/02* | (2006.01) | |
| *F21V 23/06* | (2006.01) | |
| *F21V 23/00* | (2015.01) | |
| *H01L 33/62* | (2010.01) | |
| *F21Y 107/10* | (2016.01) | |
| *F21Y 113/13* | (2016.01) | |
| *F21Y 107/70* | (2016.01) | |
| *F21Y 107/60* | (2016.01) | |
| *H01L 33/48* | (2010.01) | |
| *F21Y 105/14* | (2016.01) | |
| *F21Y 115/10* | (2016.01) | |

(52) U.S. Cl.
CPC ............ *F21V 23/003* (2013.01); *F21V 23/02* (2013.01); *F21V 23/06* (2013.01); *F21V 33/006* (2013.01); *H01L 25/0753* (2013.01); *H01L 33/62* (2013.01); *H05B 45/00* (2020.01); *H05B 45/20* (2020.01); *F21Y 2105/14* (2016.08); *F21Y 2107/10* (2016.08); *F21Y 2107/60* (2016.08); *F21Y 2107/70* (2016.08); *F21Y 2113/13* (2016.08); *F21Y 2115/10* (2016.08); *H01L 33/48* (2013.01); *Y02P 60/149* (2015.11)

(56) References Cited

U.S. PATENT DOCUMENTS

| | | | |
|---|---|---|---|
| 7,617,857 | B2 | 11/2009 | Froese |
| 8,471,274 | B2 | 6/2013 | Golle et al. |
| 8,674,616 | B2 | 3/2014 | Holman et al. |
| 9,074,758 | B2 | 7/2015 | Oraw et al. |
| 9,116,276 | B2 | 8/2015 | Montfort et al. |
| 9,194,124 | B2 | 11/2015 | Johnson |
| 9,618,171 | B2 | 4/2017 | Sepkhanov et al. |
| 9,903,574 | B2 | 2/2018 | Golle et al. |
| 10,077,877 | B2 | 9/2018 | Nicolai et al. |
| 2007/0090387 | A1 | 4/2007 | Daniels |
| 2013/0301249 | A1 | 11/2013 | Ngai et al. |
| 2014/0016315 | A1* | 1/2014 | Yu .................... F21V 11/00 362/235 |
| 2015/0109765 | A1* | 4/2015 | Sepkhanov ........... E04B 1/86 362/147 |

\* cited by examiner

METHOD AND APPARATUS FOR AN ACOUSTIC-CONTROL LIGHT FIXTURE

CROSS-REFERENCE TO RELATED APPLICATIONS

This application is a continuation of U.S. patent application Ser. No. 15/811,660, filed Nov. 13, 2017 by John T. Golle et al. and titled "ACOUSTIC-CONTROL LIGHT FIXTURE AND METHOD FOR MAKING AND USING" (which issued as U.S. Pat. No. 10,215,387 on Feb. 26, 2019), which claims priority benefit, under 35 U.S.C. § 119(e), of U.S. Provisional Patent Application No. 62/421,970 filed Nov. 14, 2016 by Michael C. Naylor et al., titled "Plant growth lighting system and method," U.S. Provisional Patent Application No. 62/486,444 filed Apr. 17, 2017 by John T. Golle et al., titled "Plant growth lighting system and method," U.S. Provisional Patent Application No. 62/574,172 filed Oct. 18, 2017 by John T. Golle et al., titled "Lighting fixture and method for making and using," U.S. Provisional Patent Application No. 62/574,193 filed Oct. 18, 2017 by John T. Golle et al., titled "Lighting fixture and method for making and using," U.S. Provisional Patent Application No. 62/574,194 filed Oct. 18, 2017 by John T. Golle et al., titled "Lighting fixture and method for making and using," and U.S. Provisional Patent Application No. 62/576,646 filed Oct. 24, 2017 by John T. Golle et al., titled "Lighting fixture and method for making and using," each of which is incorporated herein by reference in its entirety.

This invention is related to

U.S. Provisional Patent Application No. 61/894,495 filed Oct. 23, 2013 by Aaron J. Golle et al., titled "High powered LED light module with a balanced matrix circuit,"

P.C.T. Patent Application No. PCT/US2014/061594 filed Oct. 21, 2014 by Aaron J. Golle et al., titled "High powered LED light module with a balanced matrix circuit," which published as PCT Publication WO/2015/061332, U.S. patent application Ser. No. 15/031,564 filed Apr. 22, 2016 by Aaron J. Golle et al., titled "High powered LED light module with a balanced matrix circuit," which issued as U.S. Pat. No. 9,903,574 on Feb. 27, 2018, and U.S. Pat. No. 8,471,274 issued Jun. 25, 2013 to Aaron J. Golle, et al. with the title "LED light disposed on a flexible substrate and connected with a printed 3D conductor," which are all incorporated herein by reference in their entirety.

FIELD OF THE INVENTION

The present invention relates to devices and methods for acoustic control, and in particular to a lighting system and methods for making and using the lighting system for such acoustic-control applications as architectural lighting and/or lighted acoustical-tile applications.

BACKGROUND OF THE INVENTION

One problem with LED illumination of large areas with a large amount of light is to manage the heat from the LED devices, and in particular, to prevent the large temperature rise associated with locating a large number of LED devices in a small area, to efficiently power the devices from a low-cost power supply, and to provide a low-cost substrate on which to mount the LED devices.

Architectural lighting often needs different spectra of light and different amounts of light for different times of the day.

U.S. Pat. No. 8,471,274 to Golle, et al. issued on Jun. 25, 2013 with the title "LED light disposed on a flexible substrate and connected with a printed 3D conductor," and is incorporated herein by reference. U.S. Pat. No. 8,471,274 describes a flexible planar substrate including a first surface that is planar, at least one bare light-emitting-diode ("LED") die coupled to the substrate and conductive ink electrically coupling the at least one bare LED die, wherein the conductive ink is disposed on the substrate and extends onto a surface of the LED that is out-of-plane from the first surface.

U.S. Pat. No. 7,607,815 to Pang issued on Oct. 27, 2009 with the title "Low profile and high efficiency lighting device for backlighting applications" and is incorporated herein by reference. U.S. Pat. No. 7,607,815 describes a light source having a flexible substrate and a plurality of dies having LEDs is disclosed. The light source can be conveniently utilized to provide an extended light source by bonding the light source to a suitable light pipe. The substrate is divided into first and second regions. The dies are bonded to the substrate in a first region. A portion of the surface of the substrate in the second region is reflective. The substrate is bent such that the second region forms a reflector that reflects light that would otherwise be emitted in a non-useful direction to a more useful direction. The substrate can be constructed from a three-layer flexible circuit carrier in which the dies are mounted on a bottom metal layer to provide an improved thermal path for heat generated in the dies.

U.S. Pat. No. 7,617,857 to Froese issued Nov. 17, 2009 with the title "Illuminated window blind assembly" and is incorporated herein by reference. U.S. Pat. No. 77,617,857 describes an illuminated blind assembly having either horizontally oriented slats or vertically oriented slats. The slats have structure that allows them to be illuminated. The slats can be A.C. or D.C. powered. The window blind assembly may have a housing containing rechargeable batteries. These batteries can be charged by photovoltaic solar cells that are positioned on the top surfaces of the slats. The window blind assembly can have a tilt/raise/lower pulley system structure and electrical servos in a housing extending across the top of the window blind assembly. An infrared remote sensor can be located in the front of the housing for controlling the electric servos and the switch for lighting up the slats.

U.S. Pat. No. 9,116,276 to Montfort et al. issued on Aug. 25, 2015 with the title "Room divider with illuminated light guide blind blade" and is incorporated herein by reference. U.S. Pat. No. 9,116,276 describes an apparatus that includes a first holder configured to hold a light source and having an interface for receiving power to feed to said light source, and a light guide plate configured to be coupled to said first holder and guide light emitted by the light source out from at least one surface of the light guide plate.

What is needed is a more efficient and effective lighting solutions that are useful for architectural lighting and acoustic control.

SUMMARY OF THE INVENTION

The present invention provides perforated LED illumination sheets and acoustic tiles, each LED illumination sheet (optionally being a flexible sheet) supporting an array of LEDs that are interconnected in parallel and in series. In some embodiments, the parallel-series interconnections connect rows of LEDs in parallel, wherein each LED in the row has substantially the same voltage drop and substantially the same current through the respective LED, and a plurality of such rows are connected in series from a common voltage supply conductor to a common ground conductor. In some embodiments, there are no required conductor crossings of the parallel-series interconnections, so a single single-layer conductor pattern is deposited on the substrate, reducing the cost of the substrate.

In some embodiments, the parallel-series interconnections are arranged in a rectangular grid (e.g., in some embodiments, a grid of squares), and in the center of each grid rectangle or square, the substrate is removed, leaving a rectangle or square opening, optionally having rounded corners to help prevent tearing that can otherwise occur if the corners were sharp.

In some embodiments, the present invention provides a perforated flexible illumination sheet for use in lighted acoustical-tile applications.

DETAILED DESCRIPTION OF THE INVENTION

Figure 1B:
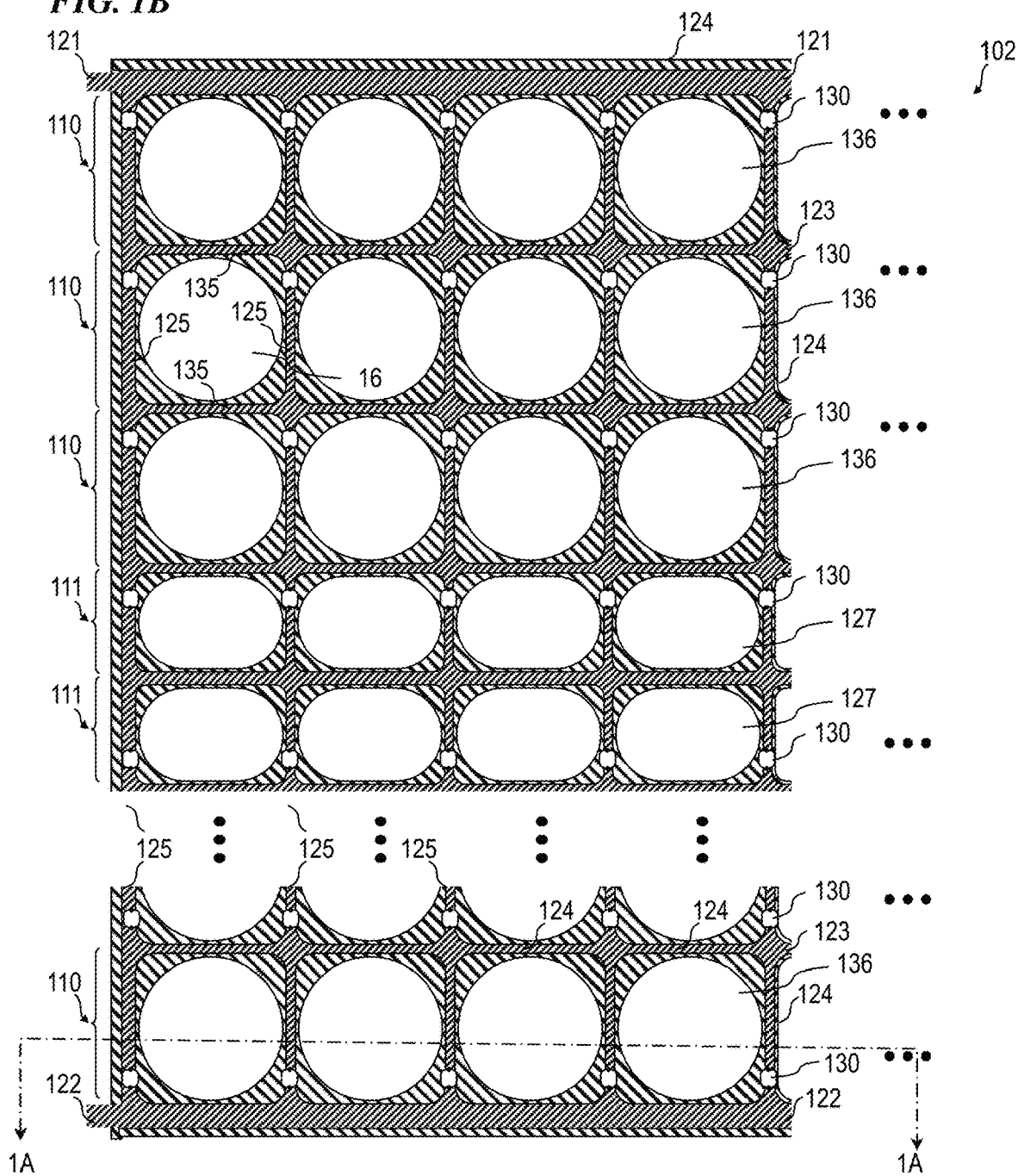
FIG. 1B is a plan view of a portion of a perforated light-sheet 102 with round holes, according to some embodiments of the present invention.

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

It is specifically contemplated that the present invention includes embodiments having combinations and subcombinations of the various embodiments and features that are individually described herein (i.e., rather than listing every combinatorial of the elements, this specification includes descriptions of representative embodiments and contemplates embodiments that include some of the features from one embodiment combined with some of the features of another embodiment, including embodiments that include some of the features from one embodiment combined with some of the features of embodiments described in the patents and application publications incorporated by reference in the present application). Further, some embodiments include fewer than all the components described as part of any one of the embodiments described herein.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

In some embodiments, the present invention provides a 12" by 24" 2-mil polyethylene terephthalate (PET)/1-oz. copper flex circuit with 288 LEDs spaced uniformly at one-inch pitch in both the X and Y directions and operating at a power density of 48 W/ft$^2$ can have on the order of 60% (or more) of the substrate removed leaving the circuit containing LEDs intact. Higher power densities can be accommodated by increasing the copper thickness and, if needed, replacing the PET substrate with higher-temperature-capable substrates such as polyethylene naphthalate (PEN) or polyimide.

Various degrees of perforation can be achieved in a 12" by 24" circuit containing 288 LEDs as shown in Table 1 (see also sketches FIG. 1B and FIG. 1C):

TABLE 1

| Shape | Size | Number of holes | Total open area (in$^2$) | % Open area |
|---|---|---|---|---|
| Circle | 0.25" Dia. | Up to 230 | 11.3 | 3.9 |
| Circle | 0.5" Dia. | Up to 230 | 45.2 | 16 |
| Rectangle | 0.5625" × 0.75" | Up to 230 | 97 | 34 |

For a circuit of 144 LEDs, there could be up to quantity one-hundred ten (110) rectangular openings at 1.75"×0.5625" and up to quantity ten (10) rectangular openings at 0.75"×0.5625" for a total open area of 112.5 in$^2$, or 39.1%.

In some embodiments, perforated flexible illumination sheets are used illuminate the exposed face of an acoustic tile.

It is understood that these concepts can be produced in various shapes and sizes and in a broad range of LED and power densities.

In some embodiments, perforated flexible illumination sheets of the present invention are used as tiled sheets, attached to carrier materials (either flexible or rigid), and incorporated into cartridges as described below.

In some embodiments, used with a front surface or without, a light sheet of the present invention is optionally protected against water, corrosion, and chemicals with a conformal coating. Parylene, acrylic, polyurethane, and silicone are some of the materials that are used, in some embodiments. In some embodiments, spray, dip, and vacuum deposition are some of the methods for applying the coating. In some embodiments, it is important that the coating used does not adversely affect the performance (color, light output, etc.) of the LEDs. In some embodiments, without a surface in front of the LEDs, the cartridge optionally includes a circumferential and/or intermediate lip on the cartridge. The lip helps protect the LEDs. Further, the lip can be an advantage in a slide-in horizontal rack system so that the rack features do not contact the LEDs.

In some embodiments, rather than a flexible circuit, a rigid or semi-rigid light-sheet circuit substrate (e.g., in some embodiments, a circuit that is formable by the temporary application of heat to a temperature above the normal operating temperature) is used, wherein the rigid or semi-rigid circuit also provides a thin curved light source that has one or more end caps that provide support and a functionality of attachment to a vertical or horizontal (or other angle) pole.

In some embodiments, the thin (optionally flat or curved) LED circuit (whether using flexible circuitry or semi-rigid or rigid circuit boards) of the present invention requires no fans or heavy metal heat sinks, which significantly reduces the cost of the LED system of the present invention versus others on the market by up to 50%.

In some embodiments, the present invention is thin and efficient. In some embodiments, the present invention requires no fan or bulky metal housing to dissipate heat. In some embodiments, the present invention is both minimalistic and functional.

In some embodiments, the present invention provides a flexible substrate having a plurality of LEDs affixed thereto, such as described in U.S. Pat. No. 8,471,274 to Aaron J. Golle, et al., which is incorporated herein by reference. In some embodiments, the color spectra emitted by a plurality of LEDs are selected to optimize one or more aspects of plant growth. In some embodiments, the color spectra emitted by a plurality of LEDs are selected to optimize one or more aspects of architectural ambience, and different spectra are sued for different times of day. In some embodiments, a large number of LEDs (e.g., in some embodiments, two sets of 144 LEDs per set) are provided, while in other embodiments, some other suitable number of LEDs such as one or more sets, each set having 64, 100, 121, 144, 169, 196, 225 or some other suitable number of LEDs are used), wherein the LEDs are driven with a relatively low amount of electrical current in order to minimize excess heat.

In some embodiments, some of the LED sheets contain 144 LEDs of red and blue spectra as described above, spaced on a one-inch-by-one-inch grid or a one-inch-by-two-inch grid or a 1-inch-by-half-inch grid (144, 72, or 288 LEDs per square foot), and others of the LED sheets contain 288 LEDs of "white" spectra as described above. In some embodiments, each sheet includes red, blue and white LEDs all in a grid on each LED tile sheet.

Figure 1A:
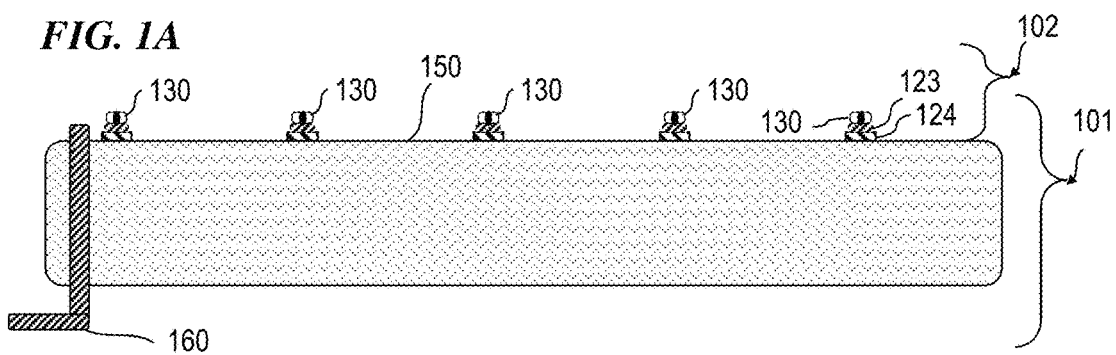
FIG. 1A is a side view of an illumination acoustic tile 101 according to some embodiments of the present invention.

FIG. 1A is a side view of a portion of an acoustic-tile-with-perforated-light-sheet 101, according to some embodiments of the present invention. In some embodiments, acoustic-tile 101 includes a conventional acoustic tile 150 having a light sheet 102 (see FIG. 1B) adhered or otherwise held across the surface oft tile 150. In some embodiments, a plurality of conductors 160 provides a back-of-tile connection to an electrical power source to supply electrical current to conductors 121-122 of light sheet 102. In some embodiments, cutline 1A of FIG. 1B shows the location of the cross-section portions of the light sheet 102 shown in FIG. 1A.

FIG. 1B is a plan view of a portion of a perforated light-sheet 102 with round holes, according to some embodiments of the present invention. In some embodiments, light sheet 102 includes a plurality of LEDs 130 mounted on junctions of series conductors 125, which are connected to one another between rows of LEDs by parallel conductors 135, wherein a polymer substrate 124 is visible in the rectangular space with rounded corners between each adjacent pair of series conductors 125 and each adjacent pair of parallel conductors 135. In some embodiments, each LED is mounted right next to a junction between parallel conductor and a series conductor, in order to be as close as possible to the larger metal area of the junction in order to better spread the heat from the operating LED to the horizontal parallel conductors 135 to the left and right of the junction and to the vertical series conductors 135 (above the junction and below the LED for LEDs in the upper half of non-perforated light sheet 101, and below the junction and above the LED for LEDs in the lower half of non-perforated light sheet 101). In some embodiments, each row 110 has the same height, whereas two middle rows 111 are of a smaller height, in order that all LEDs are evenly spaced vertically and the LEDs on the upper-edge row and the lower-edge row are closer to the top and bottom conductors 121 and 122. In some embodiments, top conductor 121 is the DC power-supply conductor and bottom conductor 122 is the DC ground conductor. In some embodiments, polymer substrate 124 extends slightly beyond the outer edge of the top and bottom conductors 121 and 122, and of the left-most and right-most series conductors 125.

In some embodiments, perforated light-sheet 102 is substantially similar to light sheet 103 as described above for FIG. 1C, with the difference being that rounded holes 127 or circular holes 136 are provided between each adjacent pair of series conductors 125 and each adjacent pair of parallel conductors 135. In some embodiments, rounded holes 127 or circular holes 136 are used and the junctions between series conductors 125 and parallel conductors 135 are of larger area for increased physical panel strength and better heat spreading to keep the temperature rise smaller; however, the rounded holes 127 or circular holes 136 permit less airflow and/or sound to pass through such rounded holes 127 or circular holes 136.

Figure 1C:
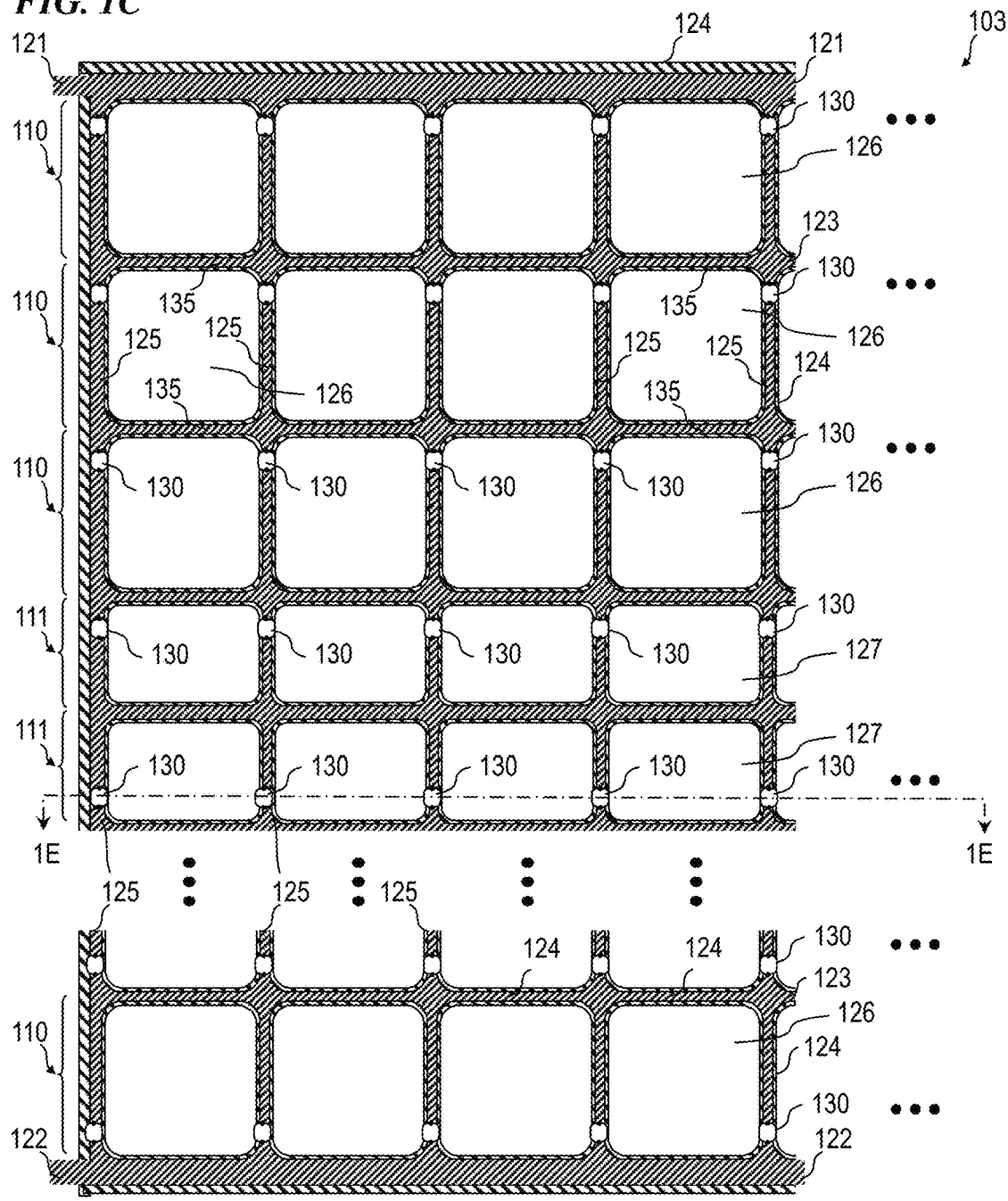
FIG. 1C is a plan view of a portion of a perforated light-sheet 103 with square holes with rounded corners, according to some embodiments of the present invention.

FIG. 1C is a plan view of a portion of a perforated light-sheet 103 with square holes with rounded corners, according to some embodiments of the present invention. In some embodiments, perforated light-sheet 102 is substantially similar to light sheet 102 as described above for FIG. 1B, with the difference being that square holes 126 or rounded rectangular holes 127 are provided between each adjacent pair of series conductors 125 and each adjacent pair of parallel conductors 135. In some embodiments, square holes 126 are used and the junctions 123 between series conductors 125 and parallel conductors 135 are of smaller area, in order for the square holes 126 to permit more airflow and/or sound to pass through such holes 126 than is the case for round holes 136, as well as providing a larger area for light from stacked perforated sheets to pass through.

Figure 1D:
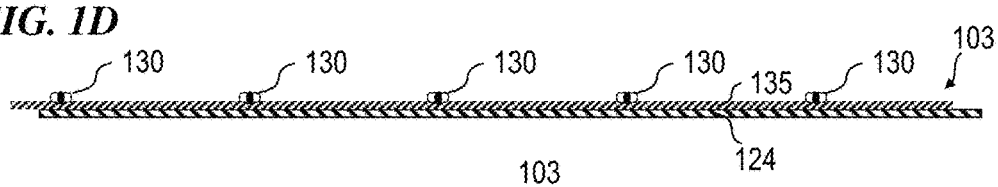
FIG. 1D is a side view of a portion of perforated light-sheet 103, according to some embodiments of the present invention.

FIG. 1D is a side view of a portion of perforated light-sheet 103, according to some embodiments of the present invention. FIG. 1D shows only the one edge parallel conductor 135 under the LEDs 130.

Figure 1E:
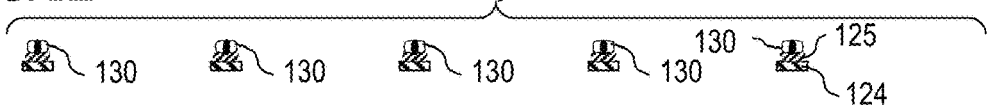
FIG. 1E is a cross-section view of a portion of perforated light-sheet 103 along section line 1E of FIG. 1C, according to some embodiments of the present invention.

FIG. 1E is a cross-section view of a portion of perforated light-sheet 103 along section line 1E of FIG. 1C, according to some embodiments of the present invention. FIG. 1E shows only the series conductors 125 under the LEDs 130.

Figure 1F:
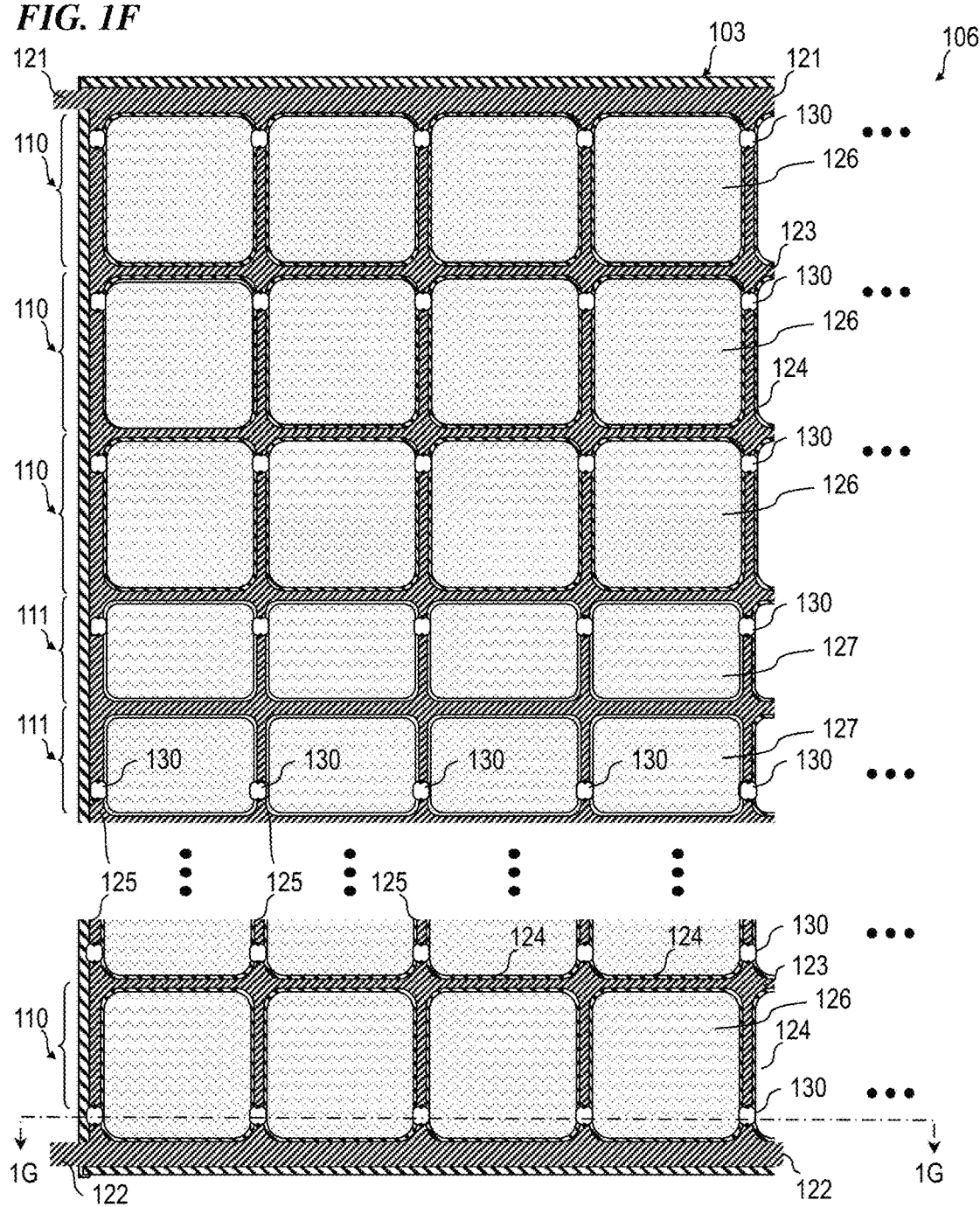
FIG. 1F is a plan view of a portion of a perforated light-sheet acoustic-tile system 106 with a single layer of perforated light-sheet 103, according to some embodiments of the present invention.

FIG. 1F is a plan view of a portion of a perforated light-sheet acoustic-tile system 106 with a single layer of perforated light-sheet 103, according to some embodiments of the present invention. In some embodiments, perforated light-sheet acoustic-tile system 106 includes an acoustic tile 150 onto which is mounted perforated light-sheet 103. In some embodiments, conductors 160 (see FIG. 1G) from the power-supply conductor 121 and the ground conductor are insulated and pass through acoustic tile 150 to the side away from the light-emitting side of perforated light-sheet acoustic-tile system 106. Section line 1G indicates the position of the cross-sectional view of FIG. 1G.

Figure 1G:
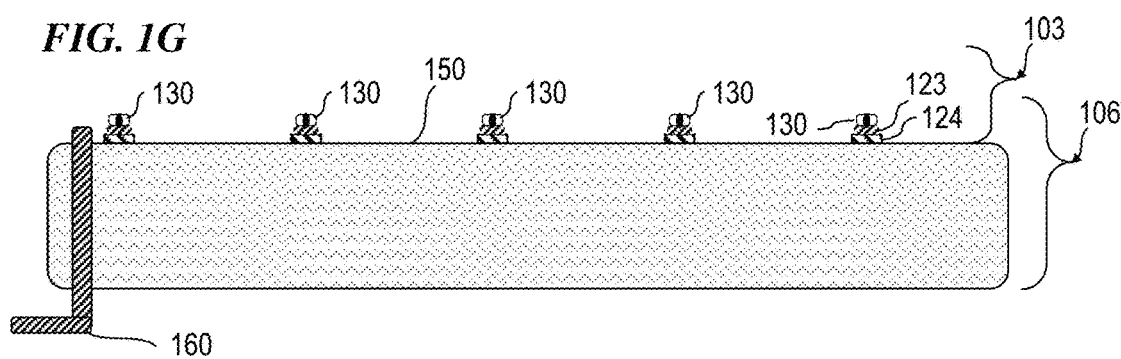
FIG. 1G is a cross-section view of a portion of perforated light-sheet acoustic-tile system 106 along section line 1G of FIG. 1F, according to some embodiments of the present invention.

FIG. 1G is a cross-section view of a portion of perforated light-sheet acoustic-tile system 106 along section line 1G of FIG. 1F, according to some embodiments of the present invention. In some embodiments, a plurality of conductors 160 from the power-supply conductor 121 and the ground conductor are insulated and pass through acoustic tile 150 to the side away from the light-emitting side of perforated light-sheet acoustic-tile system 106, and are used to connect to power supplies on the back side or to similar perforated light-sheet acoustic-tile systems 106. In some embodiments, such perforated light-sheet acoustic-tile systems 106 facilitate better sound absorption in ceiling or wall tile systems than fixtures of fluorescent lights or non-perforated light sheets.

Figure 1H:
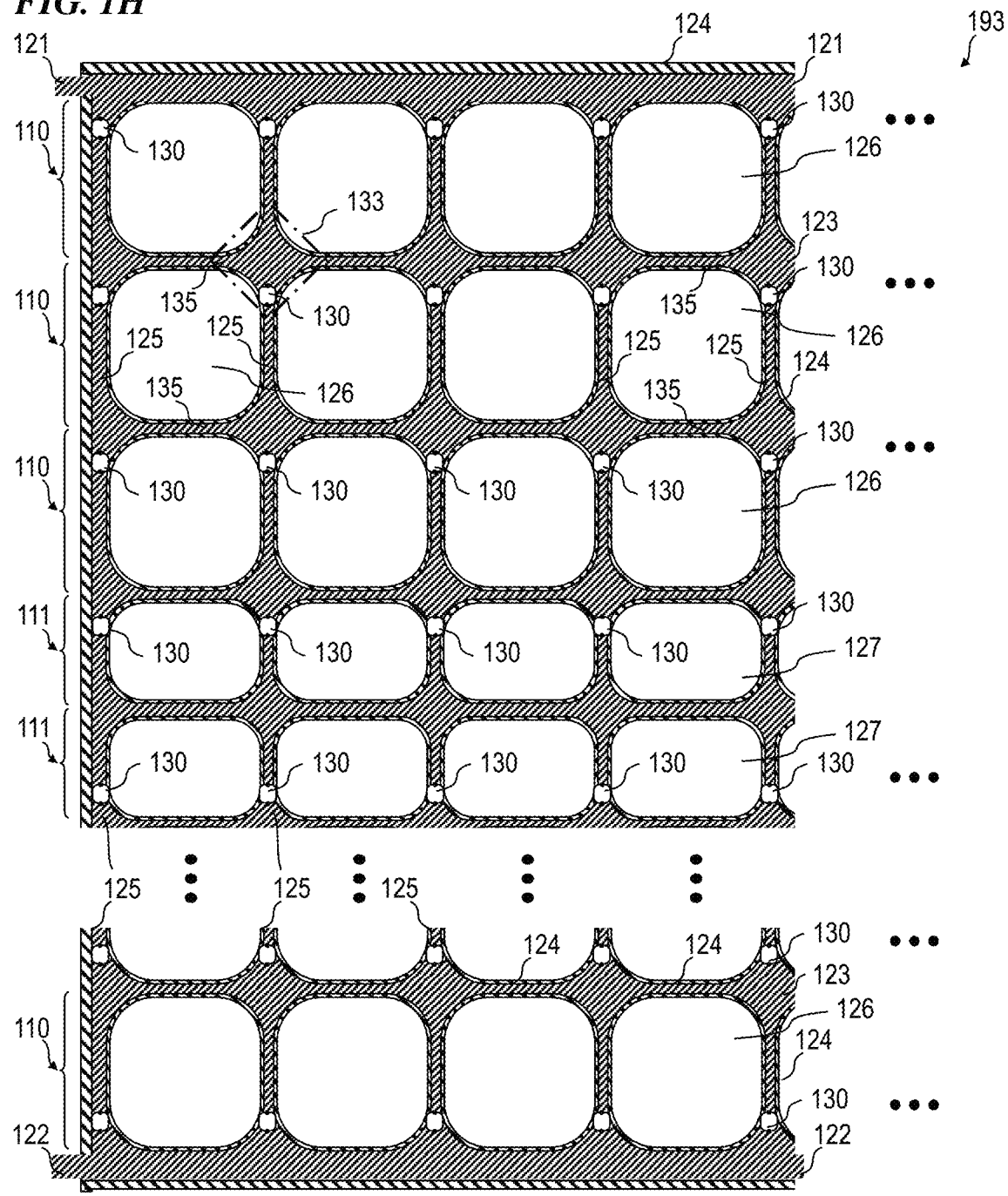
FIG. 1H is a plan view of a portion of perforated light-sheet 193 with larger series-parallel junction areas 133, according to some embodiments of the present invention.

FIG. 1H is a plan view of a portion of perforated light-sheet 193 with larger series-parallel junction areas 133, according to some embodiments of the present invention. In some embodiments, light sheet 193 includes a plurality of LEDs 130 mounted on junctions of series conductors 125, which are connected to one another between rows of LEDs by parallel conductors 135, wherein a thin rim of polymer substrate 124 is visible around the edges of the rectangular space with rounded corners between each adjacent pair of series conductors 125 and each adjacent pair of parallel conductors 135. In some embodiments, each LED is mounted right next to an enlarged-area junction 133 between parallel conductor and a series conductor, in order to be as close as possible to the larger metal area of the junction 133 in order to better spread the heat from the operating LED to the horizontal parallel conductors 135 to the left and right of the junction and to the vertical series conductors 135 (above the junction and below the LED for LEDs in the upper half of perforated light sheet 193 of FIG. 1J, and below the junction and above the LED for LEDs in the lower half of perforated light sheet 193). Other aspects of perforated light sheet 193 are as described above for non-perforated light sheet 101 of FIG. 1A or perforated light sheet 103 of FIG. 1C.

Figure 2A:
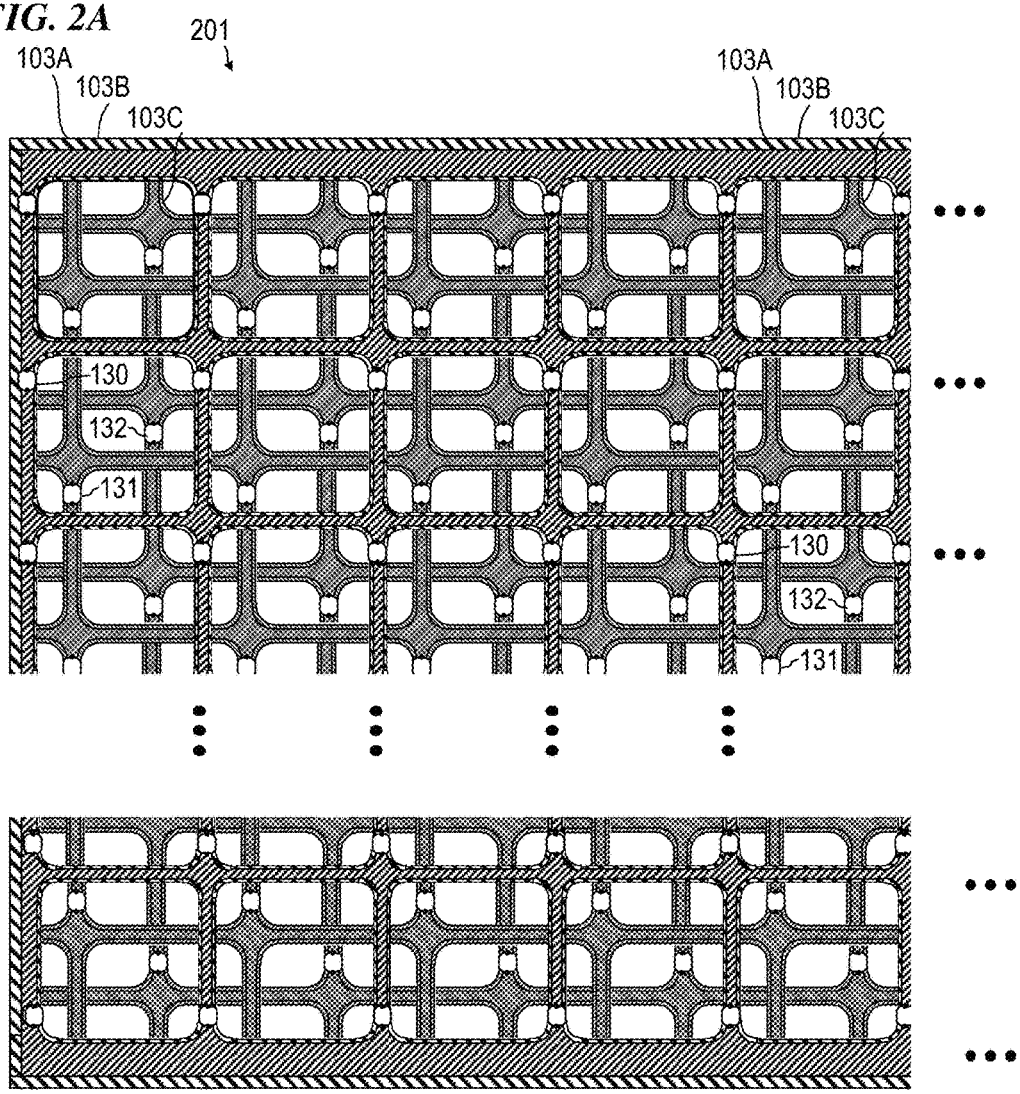
FIG. 2A is a plan view of a portion of a perforated light-sheet system 201 with a plurality of layers of perforated light-sheet 103, according to some embodiments of the present invention.

FIG. 2A is a plan view of a portion of a stacked perforated light-sheet system 201 with a plurality of layers of perforated light-sheet 103, according to some embodiments of the present invention. In some embodiments, the outermost layer 103A (with a first plurality of LEDs 130) is stacked on a middle layer 103B (with a second plurality of LEDs 131) and innermost layer 103C (with a third plurality of LEDs 132). In other embodiments, other numbers of layers are used. In some embodiments, each different layer includes a plurality of LEDs having an overall different spectrum than the spectra of other layers. In some embodiments, this allows the intensity of light of each spectrum to be controlled independent of the pother spectra (e.g., by using different duty cycles of pulse-width modulation (PWM) or different current amounts), while each light sheet 103 needs only a single layer of conductor, thus reducing costs. In other embodiments, two or more of the layers have the same of substantially similar spectra.

Figure 2B:
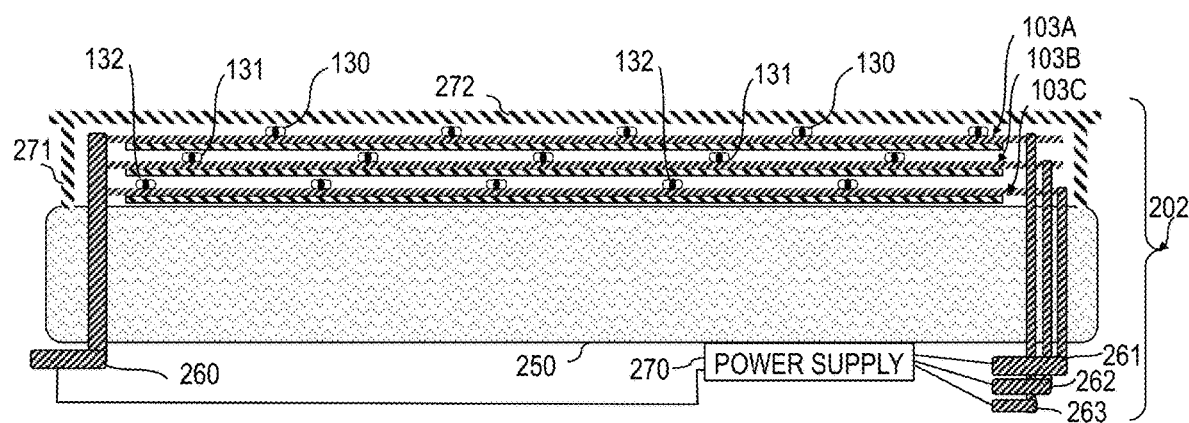
FIG. 2B is a cross-section view of a portion of perforated light-sheet acoustic-tile system 202, according to some embodiments of the present invention.

FIG. 2B is a cross-section view of a portion of perforated light-sheet acoustic-tile system 202, according to some embodiments of the present invention. In some embodiments, a stacked perforated light-sheet system 201, including a plurality of perforated light sheets (e.g., in some embodiments, 103A, 103B, 103C) is affixed to an acoustic tile 250. In some embodiments, a plurality of insulated conductors 260, 261, 262, 263 are used to supply power from the back side of the acoustic tile, thus hiding wiring and optional power supplies 270 that may be needed for the LEDs. In some embodiments, conductor 260 is used for a common connection to a plurality of perforated light-sheets 103A . . . 103C, and conductors 261, 262, 263 can be used to control so that different amounts of light are provided by each perforated light-sheets 103A . . . 103C (e.g., using pulse-width modulation (PWM), different amounts of current, or the like). In some embodiments, a power supply is connected to the AC mains (e.g., 110 volts AC) and supplies DC or PWM DC current to the various perforated light-sheets 103A . . . 103C. In some embodiments, an acoustically transparent diffuser 272 (e.g., such as diffusive micro-louvers) is supported from the tile using supports 271, and diffuses light from the LEDs while being substantially transparent to sound, which passes through to be absorbed by acoustic tile 250.

Figure 3:
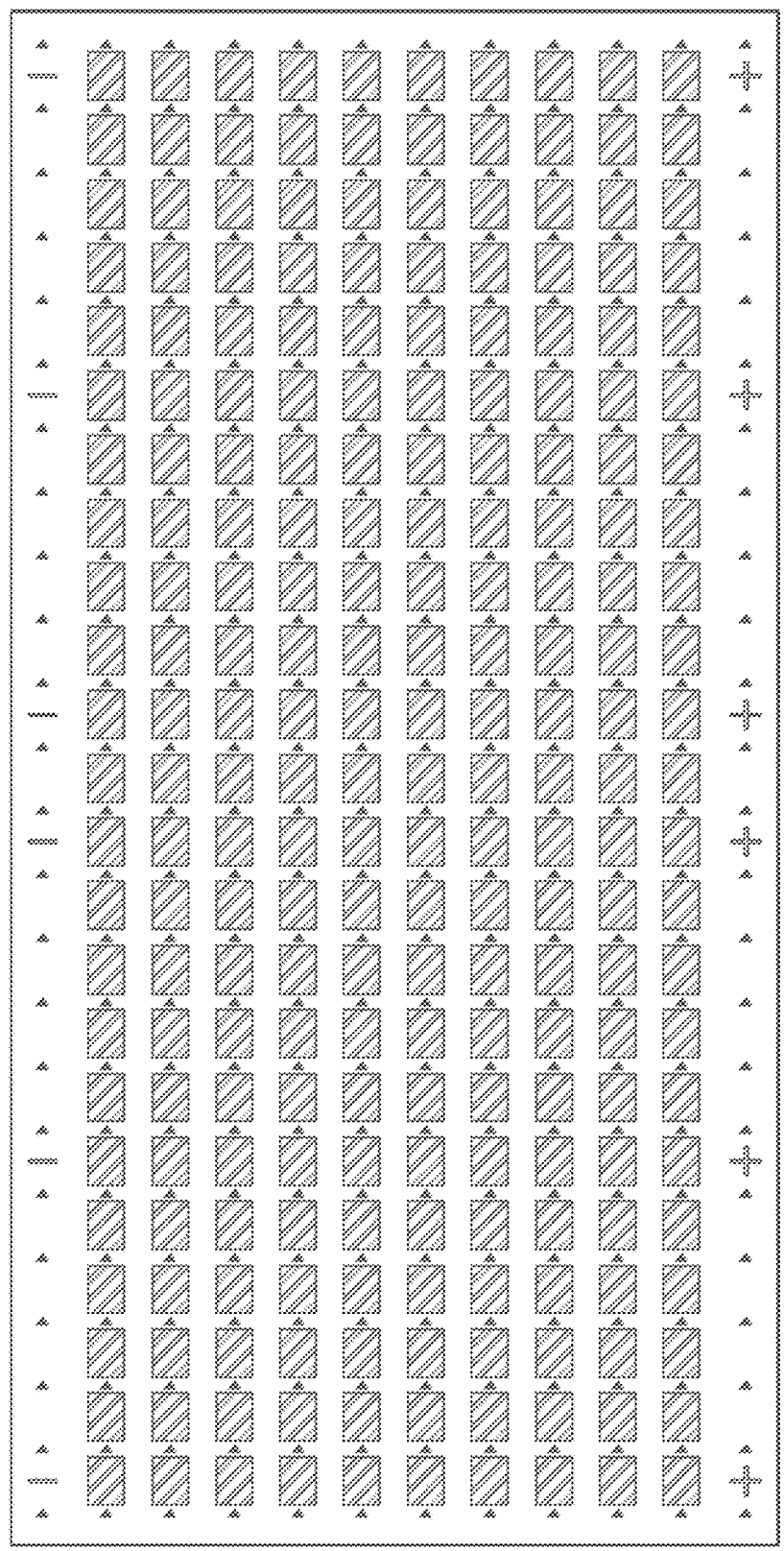
FIG. 3 is a plan view of perforated light-sheet acoustic-tile system 301 with rectangular holes, according to some embodiments of the present invention.

FIG. 3 is a plan view of perforated light-sheet acoustic-tile system 301 with rectangular holes, according to some embodiments of the present invention.

Figure 4:
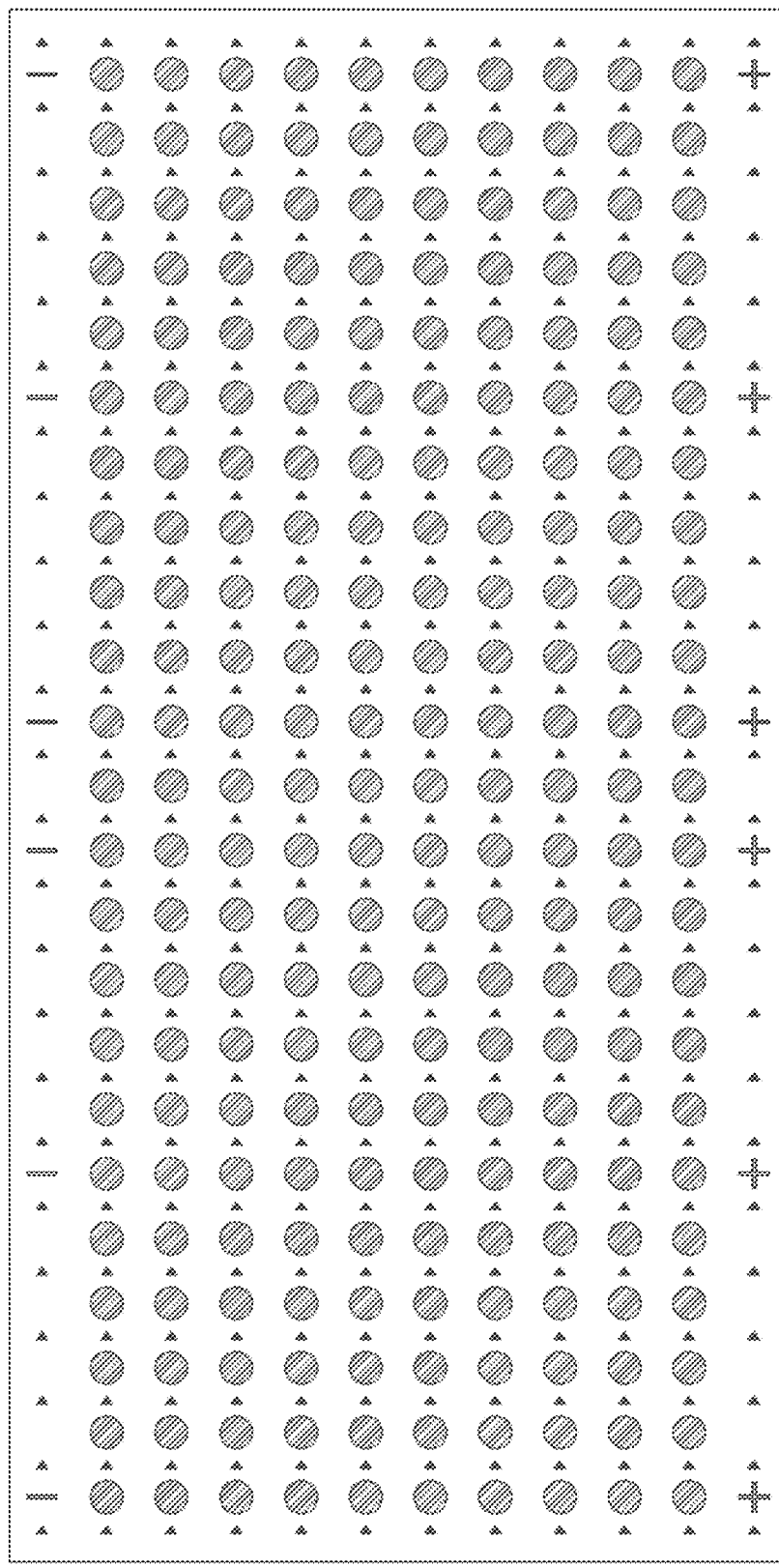
FIG. 4 is a plan view of perforated light-sheet acoustic-tile system 401 with large circular holes, according to some embodiments of the present invention.

FIG. 4 is a plan view of perforated light-sheet acoustic-tile system 401 with large circular holes, according to some embodiments of the present invention.

Figure 5:
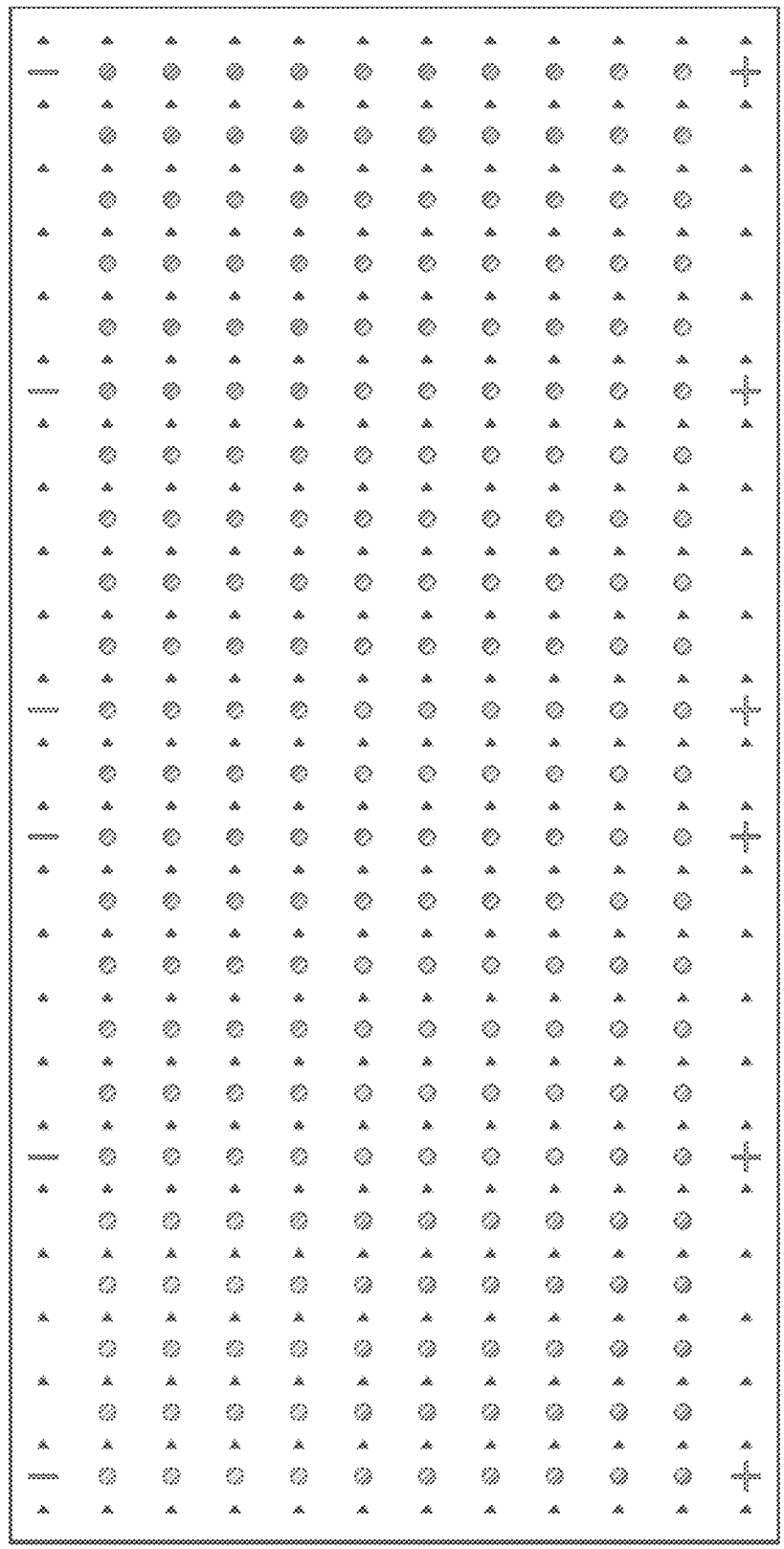
FIG. 5 is a plan view of perforated light-sheet acoustic-tile system 501 with small circular holes, according to some embodiments of the present invention.

FIG. 5 is a plan view of perforated light-sheet acoustic-tile system 501 with small circular holes, according to some embodiments of the present invention.

Figure 6:
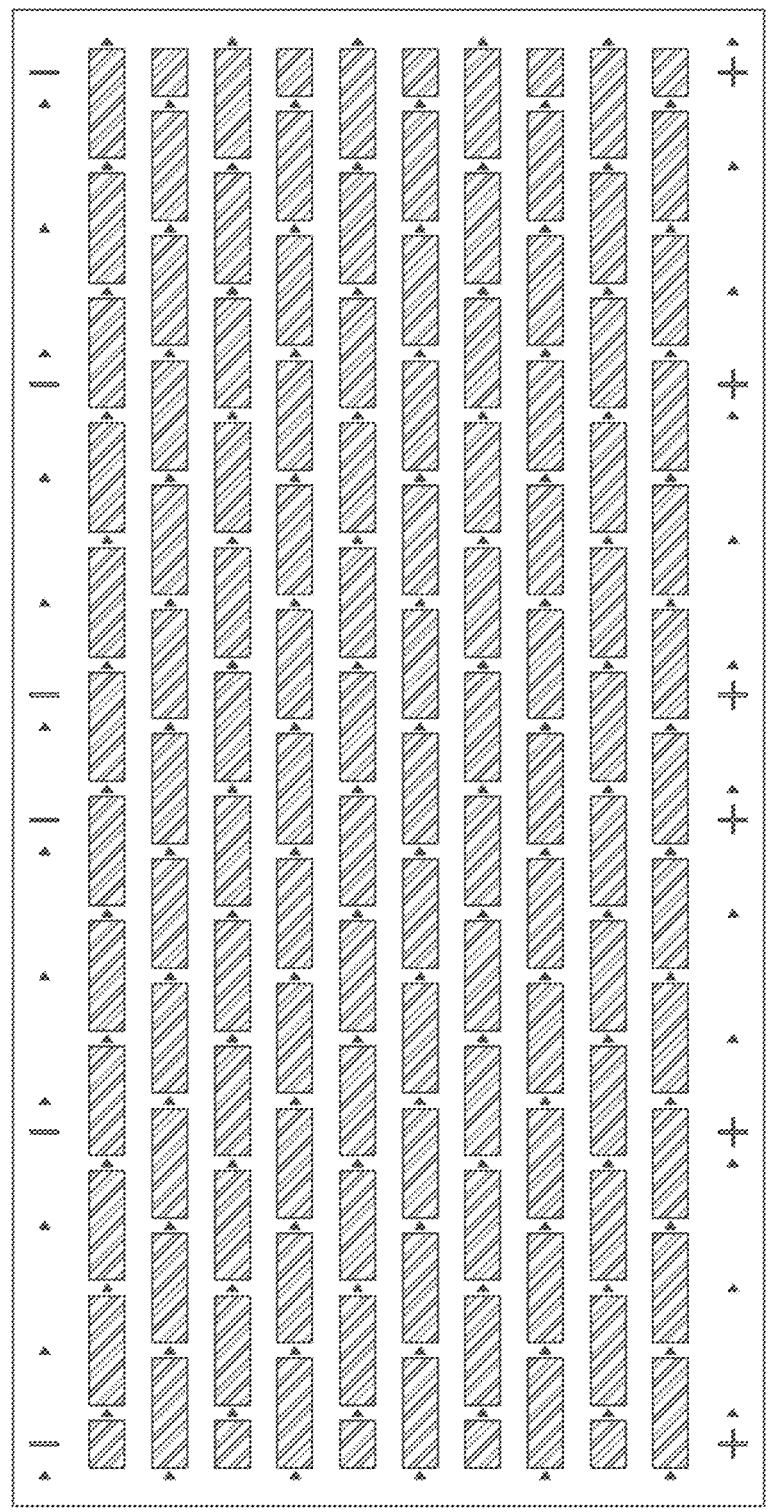
FIG. 6 is a plan view of perforated light-sheet acoustic-tile system 601 with rectangular holes of differing sizes, according to some embodiments of the present invention.

FIG. 6 is a plan view of perforated light-sheet acoustic-tile system 601 with rectangular holes of differing sizes, according to some embodiments of the present invention.

Limiting Excess Heat

In some embodiments, the present invention includes one-hundred forty-four (144) low-wattage LEDs and a flexible circuit that produces little temperature rise over the ambient temperature (e.g., in some embodiments, the flexible circuit operates at about 95 degrees Fahrenheit (about 35 degrees Celsius) with no fans and convection cooling only for the flexible circuit). Accordingly, in some embodiments, the present invention does not require active fans or clunky metal heat sinks attached to the circuit substrate. In some embodiments, the present invention minimizes fungus and mold resulting from "hot" lighting systems operating indoors.

Integral Mounting Hardware

In some embodiments, the present invention includes a universal mounting hardware system that allows the light modules of the present invention to be mounted to the floor, wall, and/or ceiling. In some embodiments, the present invention includes everything that is needed to set up and use the present invention in one box (e.g., cord, plug, and How-To-Use manual).

Minimal Heat

Some embodiment use 144 low-wattage LEDs and a patented flexible circuit (e.g., U.S. Pat. No. 8,471,274 to Golle, et al., which is incorporated herein by reference) produces minimal temperature rise (operates at 95° F. (35° C.)) allowing the LED sheets to be placed close to the plants which increases micromols per watt-second (micromols per joule) to accelerate growth/yield. Visible-light energy between 400 and 700 nanometers is the spectral region known as Photosynthetically Active Radiation or PAR; however, much light in the green region is reflected, which is why plant leaves look green. Accordingly, some embodiments of the present invention use LEDs that emit wavelengths that are absorbed by plants (such as selected red and blue wavelengths) without generating other wavelengths of white light that are not absorbed by plants and thus "wasted."

In some embodiments, the low increase in temperature relative to ambient temperature eliminates need for active fans or clunky metal heat sinks, thus lowering the cost of electricity, maintenance and replacement parts. Because of the low temperature rise, the LEDs can be placed right next to the plants (rather than being spaced 18 or more inches away, as is required by high-current LEDs, HPC, metal-halide, fluorescent or other conventional plant lights), thus reducing the volume of space required to grow a given number of plants.

In some embodiments, the low operating temperature relative to other grow-light sources also minimizes fungus and mold resulting from "hot" lighting systems operating indoors, which improves yield and minimizes loss of plants.

Broad Spectrum of Light

Some embodiments provide a unique vegetative light flux spectral distribution for acoustic tiles used to help indoor plants that acts to stimulate plants' photosynthetic triggers to optimize nutrient values and yields.

Flexible Surround Light

Some embodiments provide thin, lightweight, flexible LED sheets that can "surround" one or more plants, delivering light and extra yield under the canopy of plants.

All-Inclusive Package

In some embodiments, all elements of the invention that are needed are supplied in one box, with a How-to-Use manual that allows for quick, easy set-up and operation of the lighting system.

In some embodiments, the present invention provides a lighting apparatus that includes a flexible circuit substrate having dimensions of at least 30 cm width and at least 30 cm length, the flexible circuit substrate having a first face and an opposite second face, and a first end and an opposite second end; a first plurality of LED dice affixed to a first face of the flexible circuit substrate, wherein each die of the first plurality of LED dice emits blue light having a peak wavelength in a range of 400 nm and 500 nm, inclusive, and a full-width half maximum bandwidth of no more than 50 nm; a second plurality of LED dice affixed to the first face of the flexible circuit substrate, wherein each die of the second plurality of LED dice emits red light having a peak wavelength in a range of 600 nm and 700 nm, inclusive, and a full-width half maximum bandwidth of no more than 50 nm; a third plurality of LED dice affixed to the first face of the flexible circuit substrate, wherein each die of the third plurality of LED dice emits infrared light having a peak wavelength in a range of 700 nm and 800 nm, inclusive, and a full-width half maximum bandwidth of no more than 50 nm; a first end cap affixed to the first end of the flexible circuit substrate; a second end cap affixed to the second end of the flexible circuit substrate, wherein the first and second end caps are configured to curve the first face of the flexible circuit substrate into a concave shape; and at least a first pole bracket, wherein the first pole bracket is connected to the first end cap, and wherein the first pole bracket is configured to attach to a first pole that supports the lighting apparatus.

In some embodiments of the apparatus, each die of the first plurality of LED dice emits the blue light with a peak wavelength in a range of 420 nm and 480 nm, inclusive, and a full-width half maximum bandwidth of no more than 20 nm. In some embodiments, each die of the second plurality of LED dice emits the red light with a peak wavelength in a range of 610 nm and 690 nm, inclusive, and a full-width half maximum bandwidth of no more than 20 nm. In some embodiments, each die of the third plurality of LED dice emits the infrared light with a peak wavelength in a range of 700 nm and 780 nm, inclusive, and a full-width half maximum bandwidth of no more than 40 nm. In some embodiments, each die of the first plurality of LED dice emits the blue light with a peak wavelength in a range of 420 nm and 480 nm, inclusive, and a full-width half maximum bandwidth of no more than 20 nm; wherein each die of the second plurality of LED dice emits the red light with a peak wavelength in a range of 610 nm and 690 nm, inclusive, and a full-width half maximum bandwidth of no more than 20 nm; and wherein each die of the third plurality of LED dice emits the infrared light with a peak wavelength in a range of 700 nm and 780 nm, inclusive, and a full-width half maximum bandwidth of no more than 40 nm.

In some embodiments, each die of the first plurality of LED dice emits the blue light at a first intensity, wherein each die of the second plurality of LED dice emits the red light at a second intensity, wherein each die of the third plurality of LED dice emits the infrared light at a third intensity, and wherein the first intensity is approximately 50 percent of the second intensity. In some embodiments, each die of the first plurality of LED dice emits the blue light at a first intensity, wherein each die of the second plurality of LED dice emits the red light at a second intensity, wherein each die of the third plurality of LED dice emits the infrared light at a third intensity, wherein the first intensity is approximately 50 percent of the second intensity, and wherein the third intensity is approximately 20 percent of the second intensity. In some embodiments, the apparatus further includes a fourth plurality of LED dice affixed to the first face of the flexible circuit substrate, wherein each die of the fourth plurality of LED dice emits green light having a fourth intensity, a peak wavelength in a range of 500 nm and 560 nm, inclusive, and a full-width half maximum bandwidth of no more than 60 nm, wherein the fourth intensity is no more than approximately three (3) percent of the second intensity. In some embodiments, the apparatus further includes a fifth plurality of LED dice affixed to the first face of the flexible circuit substrate, wherein each die of the fifth plurality of LED dice emits white light having a fifth intensity, wherein the fifth intensity is no more than approximately three (3) percent of the second intensity. In some embodiments, the apparatus further includes a fourth plurality of LED dice affixed to the first face of the flexible circuit substrate, wherein each die of the fourth plurality of LED dice emits green light having a fourth intensity, a peak wavelength in a range of 500 nm and 560 nm, inclusive, and a full-width half maximum bandwidth of no more than 60 nm, wherein the fourth intensity is no more than approximately three (3) percent of the second intensity; and a fifth plurality of LED dice affixed to the first face of the flexible circuit substrate, wherein each die of the fifth plurality of LED dice emits white light having a fifth intensity, wherein the fifth intensity is no more than approximately three (3) percent of the second intensity.

In some embodiments, the present invention provides an apparatus that includes: a first perforated lighting sheet having a plurality of LEDs mounted thereon in a grid wired in parallel-series connected by a plurality of series conductors and a plurality of parallel conductors, wherein the first lighting sheet has a plurality of holes therethrough, each of the plurality of holes located between two adjacent ones of the plurality of series conductors and between two adjacent ones of the plurality of parallel conductors.

Some embodiments further include a second perforated lighting sheet having a plurality of LEDs mounted thereon in a grid wired in parallel-series connected by a plurality of series conductors and a plurality of parallel conductors, wherein the second lighting sheet has a plurality of holes therethrough, each of the plurality of holes located between two adjacent ones of the plurality of series conductors and between two adjacent ones of the plurality of parallel conductors, and wherein the first lighting sheet and the second lighting sheet are stacked one on the other such that light from the LEDs on the second lighting sheet is emitted through the holes of the first lighting sheet.

In some embodiments, the present invention provides an apparatus that includes: a lighting cartridge that includes: a first front-side lighting sheet system having a plurality of LEDs mounted thereon in a grid wired in parallel-series connected by a plurality of series conductors and a plurality of parallel conductors; a raised lip surrounding the first lighting sheet such that the LEDs are recessed from the outer edge of the raised lip; and a backside electronics enclosure that contains power-supply electronics that are operatively coupled to the plurality of LEDs.

In some embodiments, the lighting sheet system further includes a plurality of perforated lighting sheets including a first perforated lighting sheet having a plurality of LEDs mounted thereon in a grid wired in parallel-series connected by a plurality of series conductors and a plurality of parallel conductors, wherein the first lighting sheet has a plurality of holes therethrough, each of the plurality of holes located between two adjacent ones of the plurality of series conductors and between two adjacent ones of the plurality of parallel conductors, and a second perforated lighting sheet having a plurality of LEDs mounted thereon in a grid wired in parallel-series connected by a plurality of series conductors and a plurality of parallel conductors, wherein the second lighting sheet has a plurality of holes therethrough, each of the plurality of holes located between two adjacent ones of the plurality of series conductors and between two adjacent ones of the plurality of parallel conductors, and wherein the first lighting sheet and the second lighting sheet are stacked one on the other such that light from the LEDs on the second lighting sheet is emitted through the holes of the first lighting sheet.

In some embodiments, the present invention provides an apparatus that includes: a light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum, wherein the first lighting sheet includes a plurality of holes through the insulating substrate of the first lighting sheet, wherein each one of the plurality of holes through the insulating substrate of the first lighting sheet is positioned between an adjacent pair of rows of electrical conductors and between an adjacent pair of columns of electrical conductors of the first lighting sheet; and an acoustic tile, wherein the first lighting sheet is mounted to the acoustic tile.

In some embodiments, the insulating substrate is flexible and formed of at least one polymer.

In some embodiments, the insulating substrate is adhered to the acoustic tile using at least one adhesive.

In some embodiments, the insulating substrate is adhered to the acoustic tile using at least one pressure-sensitive adhesive.

Some embodiments further include a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet.

Some embodiments further include a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet; and wherein the first lighting sheet and the second lighting sheet each includes a plurality of LED tiles, each LED tile including a plurality of LEDs arranged on a respective grid.

Some embodiments further include a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet; and a power supply operatively coupled to the first plurality of LEDs and the second plurality of LEDs, and configured to supply a variable-duty pulse-width modulated current to at least the first plurality of LEDs in order to vary a total color spectrum of the apparatus.

In some embodiments, the lighting system is mounted to the acoustic tile using at least one mechanical fastener.

Some embodiments further include a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is substantially equal to the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet.

Some embodiments further include a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors; a third lighting sheet, wherein the third lighting sheet includes a third plurality of LEDs arranged on a grid of intersecting rows and columns of electrical conductors on an insulating substrate, wherein the third plurality of LEDs emit light having a third color spectrum, wherein the third color spectrum is different than the first color spectrum and different than the second color spectrum, wherein the third lighting sheet includes a plurality of holes through the insulating substrate of the third lighting sheet, wherein each one of the plurality of holes through the insulating substrate of the third lighting sheet is positioned between an adjacent pair of rows of electrical conductors and between an adjacent pair of columns of electrical conductors of the third lighting sheet, and wherein the second plurality of LEDs is offset from the LEDs of the first sheet and the third plurality of LEDs is offset from the LEDs of the first sheet and the second sheet such that light from the first plurality of LEDs and the second plurality of LEDs passes through the plurality of holes of the third lighting sheet.

In some embodiments, the present invention provides a method that includes providing a light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum, wherein the first lighting sheet includes a plurality of holes through the insulating substrate of the first lighting sheet, wherein each one of the plurality of holes through the insulating substrate of the first lighting sheet is positioned between an adjacent pair of rows of electrical conductors and between an adjacent pair of columns of electrical conductors of the first lighting sheet; and mounting the light system to an acoustic tile.

Some embodiments of the method further include forming the insulating substrate of at least one polymer and making the light system flexible.

In some embodiments of the method, mounting of the light system includes adhering the light system to the acoustic tile using at least one adhesive.

In some embodiments of the method, mounting of the light system includes adhering the light system to the acoustic tile using at least one pressure-sensitive adhesive.

In some embodiments of the method, the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet. This method further includes: positioning each one of the plurality of holes through the insulating substrate of the second lighting sheet between an adjacent pair of rows of electrical conductors and between an adjacent pair of columns of electrical conductors; and offsetting the second plurality of LEDs from the LEDs of the first sheet such that light from the first plurality of LEDs passes through the plurality of holes of the second lighting sheet.

In some embodiments of the method, the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet, and wherein the first lighting sheet and the second lighting sheet each includes a plurality of LED tiles, each LED tile including a plurality of LEDs arranged on a respective grid.

In some embodiments of the method, the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet; and supplying a variable-duty pulse-width modulated current to at least the first plurality of LEDs in order to vary a total color spectrum of the apparatus.

Some embodiments of the method further include mounting the lighting system to the acoustic tile using at least one mechanical fastener.

In some embodiments of the method, the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is substantially equal to the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet.

In some embodiments, the present invention provides an apparatus that includes: a first lighting sheet, wherein the first lighting sheet includes a first plurality of LEDs arranged on a grid of intersecting rows and columns of electrical conductors on an insulating substrate, wherein the first plurality of LEDs emit light having a first color spectrum; a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum; a third lighting sheet, wherein the third lighting sheet includes a third plurality of LEDs arranged on a grid of intersecting rows and columns of electrical conductors on an insulating substrate, wherein the third plurality of LEDs emit light having a third color spectrum, wherein the third color spectrum is different than the first color spectrum and different than the second color spectrum; means for passing light from the first plurality of LEDs and the second plurality of LEDs through the plurality of holes of the third lighting sheet and for passing sound through the first, second and third lighting sheets; and means for mounting the light system to an acoustic tile. In other embodiments, the color spectrum of two or more of the lighting sheets are equal.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method comprising:
   providing a light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum;
   mounting the light system to a first face of an acoustic tile; and
   coupling a light diffuser across the light system such that the one or more lighting sheets are located between the light diffuser and the first face of the acoustic tile, wherein the light diffuser includes a plurality of microlouvers having openings that form portions of a plurality of open-air channels that extend from an exterior of the light diffuser to the acoustic tile.

2. The method of claim 1, further comprising forming the insulating substrate of at least one polymer and making the light system flexible.

3. The method of claim 1, wherein mounting of the light system includes adhering the light system to the acoustic tile using at least one adhesive.

4. The method of claim 1, wherein mounting of the light system includes adhering the light system to the acoustic tile using at least one pressure-sensitive adhesive.

5. The method of claim 1, wherein the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, the method further comprising:
   positioning each one of the plurality of holes through the insulating substrate of the second lighting sheet between an adjacent pair of rows of electrical conductors and between an adjacent pair of columns of electrical conductors; and
   offsetting the second plurality of LEDs from the LEDs of the first sheet such that light from the first plurality of LEDs passes through the plurality of holes of the second lighting sheet.

6. The method of claim 1, wherein the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, and wherein the first lighting sheet and the second lighting sheet each includes a plurality of LED tiles, each LED tile including a plurality of LEDs arranged on a respective grid.

7. The method of claim 1, wherein the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum; and supplying a variable-duty pulse-width modulated current to at least the first plurality of LEDs in order to vary a total color spectrum of the apparatus.

8. The method of claim 1, further comprising mounting the lighting system to the acoustic tile using at least one mechanical fastener.

9. The method of claim 1, wherein the providing of the light system includes providing a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is substantially equal to the first color spectrum.

10. An apparatus comprising:
 a light system that includes:
  a first lighting sheet, wherein the first lighting sheet includes a first plurality of LEDs arranged on a grid of intersecting rows and columns of electrical conductors on an insulating substrate, wherein the first plurality of LEDs emit light having a first color spectrum;
  a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum; and
  a third lighting sheet, wherein the third lighting sheet includes a third plurality of LEDs arranged on a grid of intersecting rows and columns of electrical conductors on an insulating substrate, wherein the third plurality of LEDs emit light having a third color spectrum, wherein the third color spectrum is different than the first color spectrum and different than the second color spectrum; and
 means for mounting the light system to an acoustic tile.

11. An apparatus comprising:
 a light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum;
 an acoustic tile, wherein the first lighting sheet is mounted to a first face of the acoustic tile; and
 a light diffuser that includes a plurality of micro-louvers having openings that form portions of a plurality of open-air channels that extend from an exterior of the light diffuser to the acoustic tile, wherein the light diffuser is coupled across the light system such that the one or more lighting sheets are located between the light diffuser and the first face of the acoustic tile.

12. The apparatus of claim 11, wherein the insulating substrate is adhered to the acoustic tile using at least one adhesive.

13. The apparatus of claim 11, wherein the insulating substrate is adhered to the acoustic tile using at least one pressure-sensitive adhesive.

14. The apparatus of claim 11, further comprising:
 a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum, wherein the second lighting sheet includes a plurality of holes through the insulating substrate of the second lighting sheet, wherein each one of the plurality of holes through the insulating substrate of the second lighting sheet is positioned between an adjacent pair of rows of electrical conductors and between an adjacent pair of columns of electrical conductors, and wherein the second plurality of LEDs is offset from the LEDs of the first sheet such that light from the first plurality of LEDs passes through the plurality of holes of the second lighting sheet.

15. The apparatus of claim 11, further comprising:
 a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum; and
 wherein the first lighting sheet and the second lighting sheet each includes a plurality of LED tiles, each LED tile including a plurality of LEDs arranged on a respective grid.

16. The apparatus of claim 11, further comprising:
 a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum; and
 a power supply operatively coupled to the first plurality of LEDs and the second plurality of LEDs, and configured to supply a variable-duty pulse-width modulated current to at least the first plurality of LEDs in order to vary a total color spectrum of the apparatus.

17. The apparatus of claim 11, wherein the lighting system is mounted to the acoustic tile using at least one mechanical fastener.

18. The apparatus of claim 11, further comprising:
 a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is different than the first color spectrum;
 a third lighting sheet, wherein the third lighting sheet includes a third plurality of LEDs arranged on a grid of intersecting rows and columns of electrical conductors on an insulating substrate, wherein the third plurality of LEDs emit light having a third color spectrum, wherein the third color spectrum is different than the first color spectrum and different than the second color spectrum.

19. An apparatus comprising:
a light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum;
an acoustic tile, wherein the first lighting sheet is mounted to a first face of the acoustic tile; and
a light diffuser that includes a plurality of micro-louvers, wherein the light diffuser is coupled across the light system such that the one or more lighting sheets are located between the light diffuser and the first face of the acoustic tile, wherein the insulating substrate is flexible and formed of at least one polymer.

20. An apparatus comprising:
a light system that includes one or more lighting sheets including a first lighting sheet, wherein the first lighting sheet includes a first plurality of LEDs arranged on a grid of intersecting rows and columns of electrical conductors on an insulating substrate, wherein the first plurality of LEDs emit light having a first color spectrum;
an acoustic tile, wherein the first lighting sheet is mounted to a first face of the acoustic tile;
a light diffuser that includes a plurality of micro-louvers, wherein the light diffuser is coupled across the light system such that the one or more lighting sheets are located between the light diffuser and the first face of the acoustic tile; and
a second lighting sheet, wherein the second lighting sheet includes a second plurality of LEDs arranged on a grid of intersecting rows and columns of electrical conductors on an insulating substrate, wherein the second plurality of LEDs emit light having a second color spectrum, wherein the second color spectrum is substantially equal to the first color spectrum.

21. A light-emitting tile element comprising:
a plurality of solid-state light sources;
a sound-absorbing element having a first face and a second face, wherein the sound absorbing element is arranged such that the first face faces the plurality of solid-state light sources; and
a light-transmissive layer arranged in parallel with the first face of the sound-absorbing element, opposite the first face of the sound-absorbing element relative to the plurality of solid-state light sources, such that the plurality of solid-state light sources are provided between the light-transmissive layer and the sound-absorbing element, wherein the light-transmissive layer includes a plurality of micro-louvers having openings that form portions of a plurality of open-air channels that extend from an exterior of the light-transmissive layer to the sound-absorbing element.

* * * * *